(12) United States Patent
Xiong et al.

(10) Patent No.: US 10,181,557 B2
(45) Date of Patent: Jan. 15, 2019

(54) THIN FILM PIEZOELECTRIC ELEMENT AND MANUFACTURING METHOD THEREOF

(71) Applicant: SAE Magnetics (H.K.) Ltd., Hong Kong (CN)

(72) Inventors: Wei Xiong, Hong Kong (CN); Atsushi Iijima, Hong Kong (CN); Takao Noguchi, Hong Kong (CN)

(73) Assignee: SAE MAGNETICS (H.K.) LTD., Hong Kong (CN)

( * ) Notice: Subject to any disclaimer, the term of this patent is extended or adjusted under 35 U.S.C. 154(b) by 394 days.

(21) Appl. No.: 15/156,388

(22) Filed: May 17, 2016

(65) Prior Publication Data

US 2017/0317267 A1    Nov. 2, 2017

(30) Foreign Application Priority Data

Apr. 28, 2016  (CN) .......................... 2016 1 0281538

(51) Int. Cl.
| | |
|---|---|
| *H01L 41/09* | (2006.01) |
| *H01L 41/187* | (2006.01) |
| *H01L 41/047* | (2006.01) |
| *H01L 41/08* | (2006.01) |
| *H01L 41/083* | (2006.01) |
| *H01L 41/27* | (2013.01) |
| *H01L 41/297* | (2013.01) |

(52) U.S. Cl.
CPC ...... *H01L 41/1876* (2013.01); *H01L 41/0471* (2013.01); *H01L 41/083* (2013.01); *H01L 41/0805* (2013.01); *H01L 41/27* (2013.01); *H01L 41/297* (2013.01)

(58) Field of Classification Search
CPC ............. H01L 41/1876; H01L 41/0471; H01L 41/0805; H01L 41/083; H01L 41/27; H01L 41/297
USPC .......... 310/358; 252/62.9, 62.9 PZ; 501/134; 25/29.35
See application file for complete search history.

(56) References Cited

U.S. PATENT DOCUMENTS

| | | | | |
|---|---|---|---|---|
| 6,142,615 A | * | 11/2000 | Qiu | ...................... B41J 2/14233 347/70 |
| 6,349,454 B1 | * | 2/2002 | Manfra | .................... H03H 3/02 29/25.35 |
| 2005/0012568 A1 | * | 1/2005 | Aigner | ................. H03H 9/0095 333/187 |

(Continued)

FOREIGN PATENT DOCUMENTS

| | | | | | |
|---|---|---|---|---|---|
| JP | 200781645 A | * | 3/2007 | ............... | H03H 9/17 |
| JP | 2013194320 A | * | 9/2013 | ............. | C23C 14/06 |
| JP | 2013258395 A | * | 12/2013 | ............. | H01L 41/09 |

*Primary Examiner* — Thomas Dougherty
(74) *Attorney, Agent, or Firm* — Nixon & Vanderhye PC

(57) ABSTRACT

A manufacturing method of an epitaxial thin film piezoelectric element includes: providing a substrate; forming a bottom electrode layer on the substrate by epitaxial growth process; forming a first piezoelectric layer that has c-axis orientation on the bottom electrode layer by epitaxial growth process; forming a second piezoelectric layer that has c-axis orientation and different phase structure from the first piezoelectric layer on the first piezoelectric layer by epitaxial growth process; and forming a top electrode layer on the second piezoelectric layer. The thin film piezoelectric element has good thermal stability, low temperature coefficient and high piezoelectric constant.

14 Claims, 6 Drawing Sheets

(56) References Cited

U.S. PATENT DOCUMENTS

| | | | |
|---|---|---|---|
| 2010/0244632 A1* | 9/2010 | Maekawa | G01C 19/5607 310/360 |
| 2010/0301705 A1* | 12/2010 | Hata | G11B 5/4826 310/328 |
| 2011/0292133 A1* | 12/2011 | Sasaki | B41J 2/14233 347/68 |
| 2013/0229465 A1* | 9/2013 | Fujii | B41J 2/14233 347/72 |
| 2013/0279042 A1* | 10/2013 | Xiong | H01L 41/0805 360/86 |
| 2013/0279044 A1* | 10/2013 | Xiong | G11B 5/5552 360/99.08 |
| 2016/0240768 A1* | 8/2016 | Fujii | H01L 41/0471 |
| 2016/0320899 A1* | 11/2016 | Watazu | G06F 3/047 |
| 2017/0085247 A1* | 3/2017 | Ruby | H03H 9/25 |
| 2017/0098757 A1* | 4/2017 | Heiba | H01L 41/0933 |
| 2017/0141750 A1* | 5/2017 | Pelzel | H01L 23/66 |
| 2017/0214387 A1* | 7/2017 | Burak | H03H 9/173 |

* cited by examiner

THIN FILM PIEZOELECTRIC ELEMENT AND MANUFACTURING METHOD THEREOF

This application claims priority to CN 201610281538.3 filed 28 Apr. 2016, the entire content of which is hereby incorporated by reference.

FIELD OF THE INVENTION

The present invention relates to a piezoelectric element, and more particularly to an epitaxial thin film piezoelectric element and manufacturing method thereof.

BACKGROUND OF THE INVENTION

Piezoelectric material is processed into various piezoelectric elements in accordance with different purposes, particularly, it has been widely used for functional electronic components such as an actuator for generating deformation by applying voltage or a sensor for generating voltage from the deformation of elements in a reverse way, etc.

As the piezoelectric material used for an actuator in the disk drive unit for actuating the fine movements of the slider thereof, a lead (Pb)-based dielectric material having large piezoelectric characteristics, especially, Lead Zirconate Titanate $Pb(Zr_{1-x}Ti_x)O_3$-based perovskite-tpye ferroelectric called as "PZT", has been widely used, and the piezoelectric material is generally formed by sintering oxide which is formed of individual elements.

Crystal structure of this piezoelectric material formed of PZT varies with the ratio of $PbTiO_3/PbZrO_3$. FIG. 1a shows a phase diagram of the PZT. Curie Temperature Tc is a boundary of high-temperature cubic paraelectric phase (Pc) and low-temperature ferroelectric phase. And a morphotropic phase boundary (MPB) divides the ferroelectric phase region into two regions including a tetragonal phase region ($F_T$) and a rhombohedra phase region ($F_R$). As known, when the crystal structure is located at the MPB, the free energy of the spontaneous polarization is quite high, thus this PZT has the best electromechanical conversion property and the best piezoelectric property to obtain an excellent piezoelectric constant d31 or d33.

Moreover, epitaxial grown piezoelectric film has much less crystal defect density therefore is more favorable for the domain alignment. As the result, epitaxial grown piezoelectric film has much larger piezoelectric constant, much less leakage current, and much better thermal stability.

However, it's quite hard to control the composition exactly located at the MPB. Thus a conventional thin film piezoelectric element often applies the composition near the MPB, such as $Pb(Zr_{0.52}Ti_{0.48})O_3$ or $Pb(Zr_{0.58}Ti_{0.42})O_3$. As shown in FIG. 1b, the conventional thin film piezoelectric element 100 includes a substrate 101, two electrode layers 102, 103 formed on the substrate 101, and a piezoelectric layer 104 sandwiched between the two electrode layers 102, 103. The layers 102, 103, 104 are typically deposited by sputtering, laser ablation, Sol-gel coating, and various chemical vapor deposition (CVD) or molecular chemical vapor deposition (MOCVD). Concretely, the substrate 101 is made by Si or other materials such as MgO, etc., and the electrode layers 102, 103 are made by Pt, or conductive oxide $SrRuO_3$ (SRO), or their combinations, or other conductive materials. Conventionally, the piezoelectric layer 104 includes composition near the MPB, whose crystal structure is tetragonal phase structure or rhombohedra phase structure. However, the piezoelectric constants of this single-phase piezoelectric element 100 is still inadequate as the product requirement for stroke becomes higher and higher. Furthermore, the single-phase piezoelectric element 100 made by the conventional method has poor thermal stability and the performance is decreased under high temperature condition, and the temperature coefficient factor is high which is not desired by the manufacturers.

Thus, there is a need for an improved thin film piezoelectric element and a manufacturing method to overcome the drawbacks mentioned above.

SUMMARY OF THE INVENTION

One aspect of the present invention is to provide a manufacturing method of an epitaxial thin film piezoelectric element thereby obtaining good thermal stability, low temperature coefficient and high piezoelectric constant.

Another aspect of the present invention is to provide an epitaxial thin film piezoelectric element thereby obtaining good thermal stability, low temperature coefficient and high piezoelectric constant.

To achieve above objectives, a manufacturing method of an epitaxial thin film piezoelectric element includes: providing a substrate; forming a bottom electrode layer on the substrate by epitaxial growth process; forming a first piezoelectric layer that has c-axis orientation on the bottom electrode layer by epitaxial growth process; forming a second piezoelectric layer that has c-axis orientation and different phase structure from the first piezoelectric layer on the first piezoelectric layer by epitaxial growth process; and forming a top electrode layer on the second piezoelectric layer.

As a preferred embodiment, said forming a first piezoelectric layer comprises: sputtering the first piezoelectric layer that has (001) orientation or (002) orientation on the bottom electrode layer.

As another preferred embodiment, said forming a second piezoelectric layer comprises: sputtering the second piezoelectric layer that has (001) orientation or (002) orientation on the first piezoelectric layer.

Preferably, said forming a bottom electrode layer comprises: depositing the bottom electrode layer having (200) orientation on a surface of the substrate having (100) orientation.

Preferably, said forming a top electrode layer comprises: sputtering the top electrode layer on a surface of the second piezoelectric layer.

Preferably, the thickness ratio between the first piezoelectric layer and the second piezoelectric layer is less than or equal to 1:2.

As an embodiment, the first piezoelectric layer has a rhombohedra phase structure, the second piezoelectric layer has a tetragonal phase structure.

As another embodiment, the first piezoelectric layer and the second piezoelectric layer have composition near the morphotropic phase boundary.

A thin film piezoelectric element comprising: a substrate; and a piezoelectric thin film stack formed on the substrate, and the piezoelectric thin film stack comprising a top electrode layer, a bottom electrode layer and a first piezoelectric layer and a second piezoelectric layer sandwiched between the top electrode layer and the bottom electrode layer, wherein the first piezoelectric layer has c-axis orientation, and the second piezoelectric layer has c-axis orientation and different phase structure from the first piezoelectric layer.

Preferably, the first piezoelectric layer and the second piezoelectric layer have (001) orientation or (002) orientation.

Preferably, the bottom electrode layer have (200) orientation.

Preferably, the first piezoelectric layer has a rhombohedra phase structure, the second piezoelectric layer has a tetragonal phase structure.

Preferably, the first piezoelectric layer and the second piezoelectric layer have composition near the morphotropic phase boundary.

Preferably, the thickness ratio between the first piezoelectric layer and the second piezoelectric layer is less than or equal to 1:2.

In comparison with the prior art, the present invention provides an epitaxial thin film piezoelectric element which forms a first and second piezoelectric layers with c-axis orientation by epitaxial growth process. The two piezoelectric layers have different phase structures on the compositions, charge will build up on the two piezoelectric layers when an AC voltage is applied to the thin film piezoelectric element, thereby enhancing coercive field strength of the thin film piezoelectric element, and in turns enabling larger applied field strength without depolarization and enhancing the piezoelectric constants d31 accordingly. Moreover, thin film piezoelectric element of the present invention has good thermal stability, lower temperature coefficient, even obtains zero temperature coefficient to satisfy the requirements of the manufacturing.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1A:
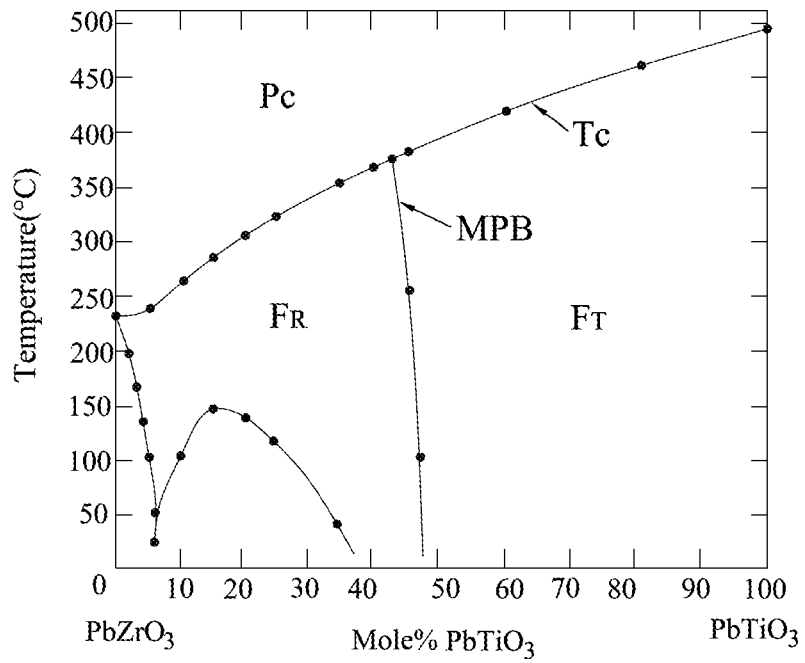
FIG. 1a is a phase diagram of a conventional PZT material.
Figure 1B:
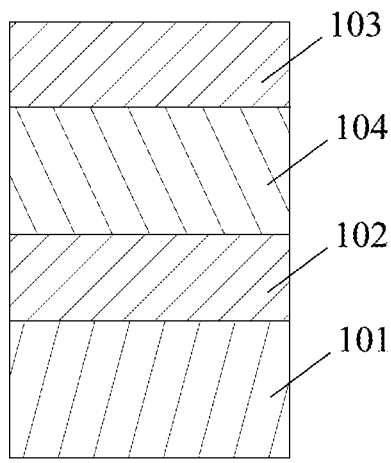
FIG. 1b is a cross-section view of a conventional thin film piezoelectric element.

Various preferred embodiments of the invention will now be described with reference to the figures, wherein like reference numerals designate similar parts throughout the various views. As indicated above, the invention is directed to an epitaxial thin film piezoelectric element and a manufacturing method thereof thereby obtaining good thermal stability, low temperature coefficient and high piezoelectric constant.

Figure 2:
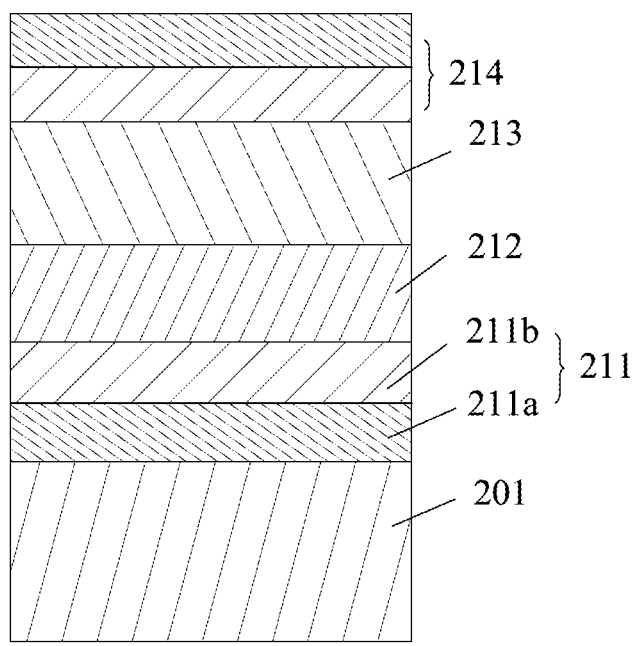
FIG. 2 shows an epitaxial thin film piezoelectric element according to one embodiment of the present invention.

Referring to FIG. 2, an epitaxial thin film piezoelectric element 200 according to one embodiment of the present invention includes a substrate 201, a bottom electrode layer 211 formed on the substrate 201 by epitaxial growth process, a first piezoelectric layer 212 and a second piezoelectric layer 213 formed on the bottom electrode layer 211 in turn by epitaxial growth process, and a top electrode layer 214 covered thereon. The first and second piezoelectric layers 212, 213 have different phase structures on the compositions, and both of them are orientated along c-axis on the substrate 201, which will be described later.

Concretely, the bottom electrode layer 211 may includes a buffer layer 211a formed on the surface of the substrate 201 by epitaxial growth process, and a bottom electrode film 211b on the buffer layer 211a by epitaxial growth process. Alternatively, the bottom electrode layer 211 may be made by the bottom electrode film 211b directly.

The substrate 201 is used for ensuring the mechanical strength of the whole thin film piezoelectric element 200, and served as the base on which the buffer layer 211a is oriented. Concretely, the substrate 201 is made by Si or other material such as MgO, etc., The buffer layer 211a may be formed by $ZrO_2$, $Y_2O_3$, $ReO_2$, and Re can be yitrium (Y) or rare earth elements, MgO, $MgAl_2O_4$, etc. Preferably, the buffer layer 211a is formed by the material selected from the group which has small lattice constant mismatch, in such a way, small lattice constant mismatch between the buffer layer 211 and the bottom electrode layer 211 is beneficial to epitaxial growth of the bottom electrode layer 211.

The bottom electrode film 211b may be formed by metals such as Pt, Ru, Rh, Pd, Ir, Au, Ag, Cu, Ni, or alloy at least including one of the metals mentioned above, such as $SrRuO_3$, $CaRuO_3$, $SrVO_3$, $SrCrO_3$. Preferably, the bottom electrode film 211b is formed by the material selected from the group which has small lattice constant mismatch with the buffer layer 211a and the first PZT layer 212.

In an example of the invention, the substrate 201 is formed by Si (100) orientated, and the bottom electrode film 211b is formed by Pt, it's preferable to make the buffer layer 211a by using the material that has small lattice mismatch between Si (100) and Pt, such as $ZrO_2$, $ReO_2$.

In this embodiment, the first piezoelectric layer 212 and the second piezoelectric layer 213 are made by $Pb(Zr_xTi_{1-x})O_3$. The thickness of the first and second piezoelectric layers 212, 213 is in a range of 0.1 μm-1.5 μm. The temperature coefficient of the thin film piezoelectric element 200 can be improved by adjusting the thickness of the first and second piezoelectric layers 212, 213. Preferably, the thickness ratio between the first piezoelectric layer and the second piezoelectric layer is less than or equal to 1:2.

As an improvement, the first piezoelectric layer 212 and the second piezoelectric layer 213 have different phase structures. As a preferred embodiment, the first piezoelectric layer 212 has a rhombohedra phase structure, for example its composition is $Pb(Zr_{0.61}Ti_{0.39})O_3$, wherein the ratio of $PbTiO_3/PbZrO_3$ is 0.423 (equivalent to the content of the $PbTiO_3$ is 42.3 mol %); and the second piezoelectric layer 213 has a tetragonal phase structure, for example its composition is $Pb(Zr_{0.58}Ti_{0.42})O_3$, wherein the ratio of $PbTiO_3/PbZrO_3$ is 0.469. In this embodiment, the composition gradient of the ratio is 0.046. Preferably, the composition gradient between two piezoelectric layers 212, 213 is in the range of 0.01~0.90.

Alternatively, the composition of the first piezoelectric layer 212 has a rhombohedra phase structure near the MPB, and the composition of the second piezoelectric layer 213 has a tetragonal phase structure near the MPB.

In the embodiment, the two piezoelectric layers 212, 213 are formed by epitaxial growth process. Specifically, the first piezoelectric layer 212 is formed by sputtering piezoelectric material on the surface of the bottom electrode layer 211, to obtain the c-axis orientated first piezoelectric layer 212, such as the (001) orientated rhombohedra phase PZT layer 212. The c-axis orientated second piezoelectric layer 213 is formed by sputtering piezoelectric material on the first piezoelectric layer 212, such as the (002) orientated tetragonal phase PZT layer 213. Alternatively, the first piezoelectric layer 212 may be (002) orientated, and the second piezoelectric layer 213 may be (001) orientated, only if the both have the overlapped c-axis orientation to obtain the maximum piezoelectric performance.

In addition, the first piezoelectric layer 212 and the second piezoelectric layer 213 have piezoelectric constant d31 during operation.

As other embodiments of the present invention, the first piezoelectric layer 212 and the second piezoelectric layer 213 can be made by $KNaNbO_3$, $LiNbO_3$, $LiTaO_3$, $BaTiO_3$, $PbTiO_3$ or $BaSrTiO_3$ materials, which are not limited, if only the compositions of the two piezoelectric layers 212, 213 have different phase structures.

The top electrode layer 214 may have the same structure with the bottom electrode layer 211.

Manufacturing methods of the epitaxial thin film piezoelectric element 200 are described as following.

Figure 3:
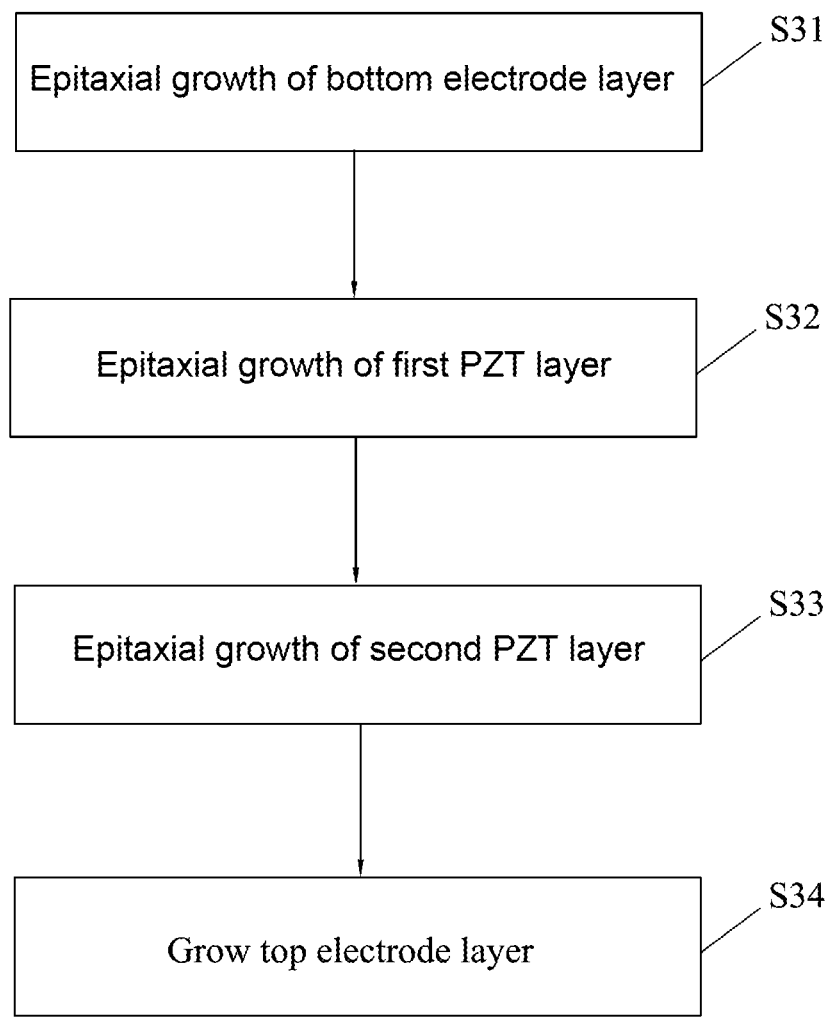
FIG. 3 is a flowchart of a manufacturing method of an epitaxial thin film piezoelectric element according to one embodiment of the present invention.

As shown in FIG. 3, first, a (200) orientated Pt layer is grown on Si (100) substrate 201 by EVP (E-beam vapor deposition) epitaxial process, and a (200) orientated SRO layer is sputtered on the surface of the (200) orientated Pt layer by epitaxial process, thereby the bottom electrode layer (Pt/SRO) 211 is formed (S31). However, the epitaxial growth method for forming the bottom electrode layer 211 is not limited; it can apply vacuum deposition process, sputtering process, pulsed laser deposition (PLD) process, chemical vapor deposition (CVD) process, chemical solution deposition (CSD) process, and the like.

And then, a (001) orientated rhombohedra phase PZT layer 212 is sputtered on the SRO layer of the bottom electrode layer 211 (S32), and a (002) orientated tetragonal phase PZT layer 213 is sputtered on the (001) orientated rhombohedra phase PZT layer 212 (S33), all by epitaxial process.

Finally, another SRO layer and another Pt layer are sputtered on the (002) orientated tetragonal phase PZT layer 213 in turn, so as to obtain the top electrode layer 214 that has the same structure with the bottom electrode layer 211 (S34). Of course, the epitaxial growth method for forming the top electrode layer 214 is not limited as well.

Figure 4:
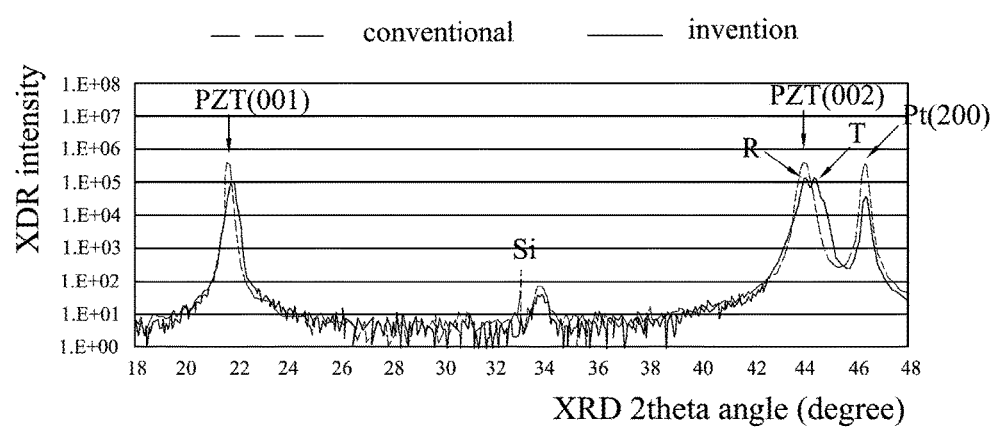
FIG. 4 is a contrast diagram of X-ray diffraction result between the epitaxial thin film piezoelectric element of the present invention and the conventional thin film piezoelectric element.

As shown in FIG. 4 which is an X-ray diffraction (XRD) result curve between the thin film piezoelectric element 200 of the present invention and conventional thin film piezoelectric element 100, the both show single crystal structure for the Si substrate, but the thin film piezoelectric element 200 of the present invention appears two overlapped peaks (as indicated by R and T) for the (002) orientated PZT layer 213, in other words, there are two phase structures existed in the thin film piezoelectric element 200; while the curve of the conventional thin film piezoelectric element 100 appears one peak (as indicated by the arrow) which indicates a single phase structure.

Figure 5:
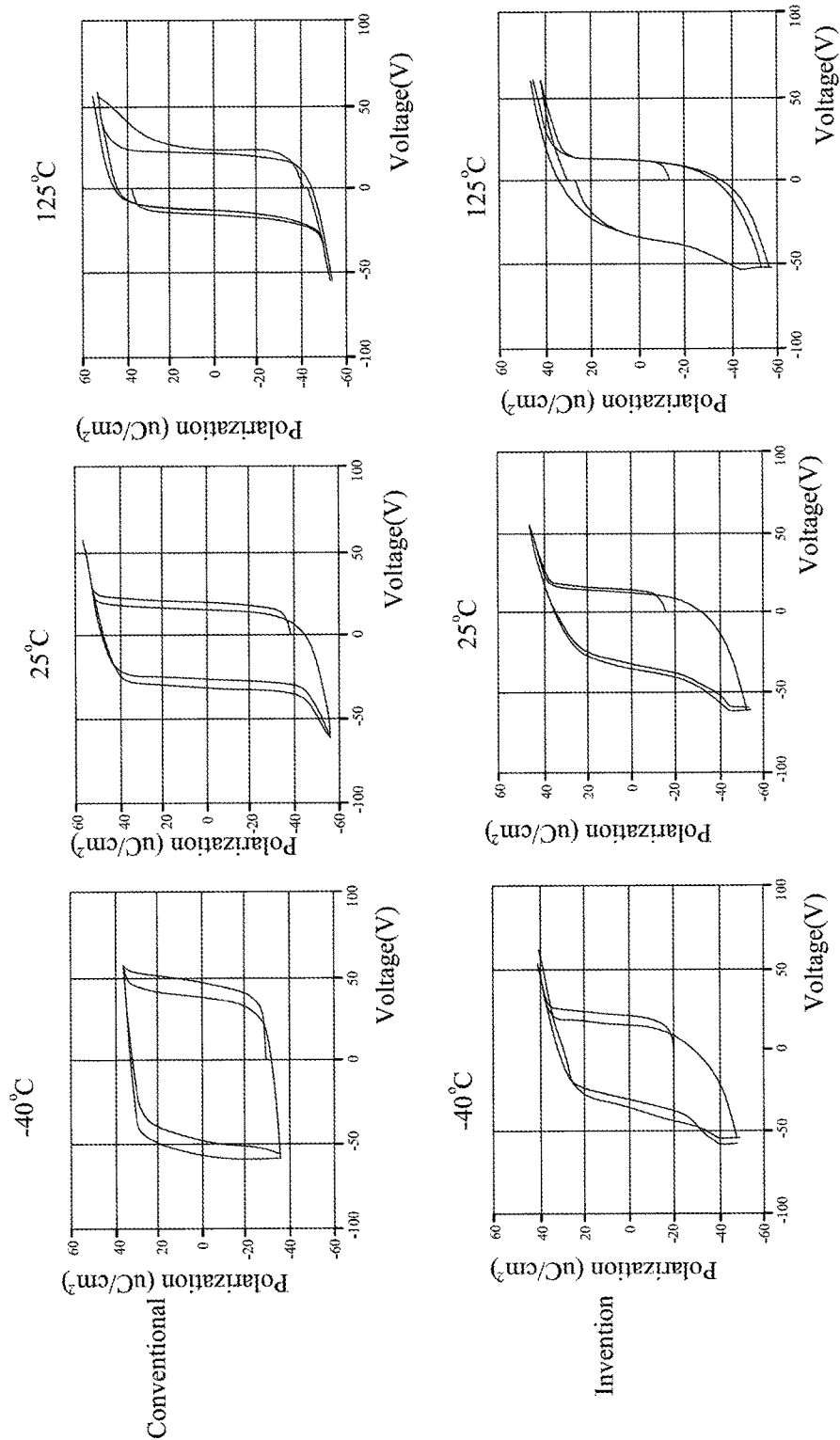
FIG. 5 is a contrast diagram of polarization offset between the epitaxial thin film piezoelectric element of the present invention and the conventional thin film piezoelectric element under an AC voltage is applied.

FIG. 5 shows a contrast diagram of polarization offset between the thin film piezoelectric element 200 of the present invention and the conventional thin film piezoelectric element 100 under AC voltages and different temperature conditions. As shown, the polarization offset of the thin film piezoelectric element 200 of the present invention is not obvious under different temperature conditions; instead the conventional one appears significant changes. By this token, the thin film piezoelectric element 200 of the present invention is less sensitive to the temperature, and has good thermal stability.

Figure 6:
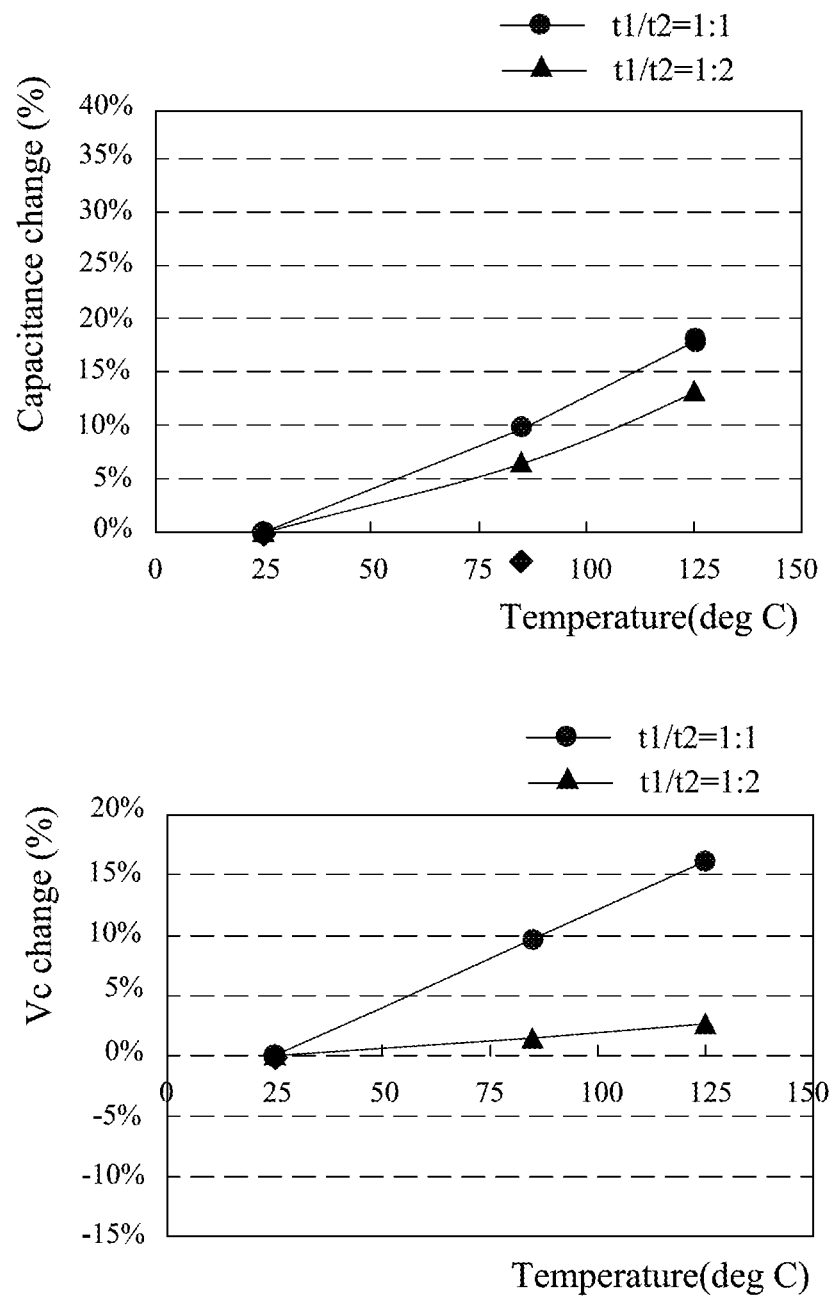
FIG. 6 is a diagram showing the temperature coefficient of the thin film piezoelectric element.

For obtaining the lower or even zero temperature coefficient factor, the thickness of the first and the second piezoelectric layers 212, 213 can be adjusted, as shown in the temperature-capacitance change curve and the temperature-Vc change curve of FIG. 6, therein the thickness ratio between the first piezoelectric layer 212 (t1) and the second piezoelectric layer 213 (t2) is 1:1 and 1:2, as shown, the latter has the better performance than the former.

In conclusion, the present invention provides an epitaxial thin film piezoelectric element which forms the bottom electrode layer, the first and the second piezoelectric layer with c-axis orientation by epitaxial growth process. The two piezoelectric layers have different phase structures on the compositions, charge will build up on the two piezoelectric layers when an AC voltage is applied to the epitaxial thin film piezoelectric element, thereby enhancing coercive field strength of the epitaxial thin film piezoelectric element, and in turns enabling larger applied field strength without depolarization and enhancing the piezoelectric constants d31 accordingly. Moreover, the epitaxial thin film piezoelectric element of the present invention has good thermal stability, lower temperature coefficient, even obtains zero temperature coefficient to satisfy the requirements of the manufacturing.

The epitaxial thin film piezoelectric element 200 of the present invention explained above can be used in microactuators, sensors etc., or other devices.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A manufacturing method of an epitaxial thin film piezoelectric element, comprising:
   providing a substrate;
   forming a bottom electrode layer on the substrate by an epitaxial growth process;
   forming a first piezoelectric layer that has a c-axis orientation on the bottom electrode layer by the epitaxial growth process;
   forming a second piezoelectric layer that has a c-axis orientation and a phase structure different from that of the first piezoelectric layer on the first piezoelectric layer by an epitaxial growth process; and
   forming a top electrode layer on the second piezoelectric layer.

2. The manufacturing method according to claim 1, wherein said forming a first piezoelectric layer comprises: sputtering the first piezoelectric layer that has a (001) orientation or a (002) orientation on the bottom electrode layer.

3. The manufacturing method according to claim 1, wherein said forming a second piezoelectric layer comprises: sputtering the second piezoelectric layer that has a (001) orientation or a (002) orientation on the first piezoelectric layer.

4. The manufacturing method according to claim 1, wherein said forming a bottom electrode layer comprises: depositing the bottom electrode layer having a (200) orientation on a surface of the substrate having a (100) orientation.

5. The manufacturing method according to claim 1, wherein said forming a top electrode layer comprises: sputtering the top electrode layer on a surface of the second piezoelectric layer.

6. The manufacturing method according to claim 1, wherein a thickness ratio between the first piezoelectric layer and the second piezoelectric layer is less than or equal to 1:2.

7. The manufacturing method according to claim 1, wherein the first piezoelectric layer has a rhombohedra phase structure, the second piezoelectric layer has a tetragonal phase structure.

8. The manufacturing method according to claim 1, wherein the first piezoelectric layer and the second piezoelectric layer have a composition near a morphotropic phase boundary.

9. An epitaxial thin film piezoelectric element comprising:
a substrate; and
a piezoelectric thin film stack formed on the substrate, and the piezoelectric thin film stack comprising a top electrode layer, a bottom electrode layer and a first piezoelectric layer and a second piezoelectric layer sandwiched between the top electrode layer and the bottom electrode layer, wherein the first piezoelectric layer has a c-axis orientation, and the second piezoelectric layer has a c-axis orientation and a phase structure different from that of the first piezoelectric layer.

10. The epitaxial thin film piezoelectric element according to claim 9, wherein the first piezoelectric layer and the second piezoelectric layer have a (001) orientation or a (002) orientation.

11. The epitaxial thin film piezoelectric element according to claim 9, wherein the bottom electrode layer has a (200) orientation.

12. The epitaxial thin film piezoelectric element according to claim 9, wherein the first piezoelectric layer has a rhombohedra phase structure, the second piezoelectric layer has a tetragonal phase structure.

13. The epitaxial thin film piezoelectric element according to claim 9, wherein the first piezoelectric layer and the second piezoelectric layer have a composition near a morphotropic phase boundary.

14. The epitaxial thin film piezoelectric element according to claim 9, wherein a thickness ratio between the first piezoelectric layer and the second piezoelectric layer is less than or equal to 1:2.

* * * * *